US006540522B2

(12) United States Patent
Sipe

(10) Patent No.: US 6,540,522 B2
(45) Date of Patent: Apr. 1, 2003

(54) ELECTRICAL CONNECTOR ASSEMBLY FOR ORTHOGONALLY MATING CIRCUIT BOARDS

(75) Inventor: Lynn Robert Sipe, Mifflintown, PA (US)

(73) Assignee: Tyco Electronics Corporation, Middletown, PA (US)

(*) Notice: Subject to any disclaimer, the term of this patent is extended or adjusted under 35 U.S.C. 154(b) by 0 days.

(21) Appl. No.: 09/843,639

(22) Filed: Apr. 26, 2001

(65) Prior Publication Data

US 2002/0160658 A1 Oct. 31, 2002

(51) Int. Cl.$^{7}$ .......................... H01R 12/00; H05K 1/00
(52) U.S. Cl. .......................................... 439/61; 439/608
(58) Field of Search ............................ 439/61, 65, 608

(56) References Cited

U.S. PATENT DOCUMENTS

| | | | |
|---|---|---|---|
| 4,472,765 A | 9/1984 | Hughes | 361/413 |
| 4,612,519 A | 9/1986 | Gargini et al. | 333/103 |
| 4,703,394 A | 10/1987 | Petit et al. | 361/413 |
| 4,876,630 A | 10/1989 | Dara | 361/413 |
| 5,062,801 A | 11/1991 | Roos | 439/61 |
| 5,122,691 A | 6/1992 | Balakrishnan | 307/475 |
| 5,167,511 A | 12/1992 | Krajewski et al. | 439/61 |
| 5,211,565 A | 5/1993 | Krajewski et al. | 439/65 |
| 5,296,748 A | 3/1994 | Wicklund et al. | 307/303.1 |
| 5,335,146 A | 8/1994 | Stucke | 361/785 |
| 5,339,221 A | 8/1994 | Conroy-Wass et al. | 361/796 |
| 5,352,123 A | 10/1994 | Sample et al. | 439/61 |
| 5,429,521 A | 7/1995 | Morlion et al. | 439/108 |
| 5,870,528 A | 2/1999 | Fukuda | 395/80 |
| 5,887,158 A | 3/1999 | Sample et al. | 395/500 |
| 5,924,899 A | 7/1999 | Paagman | 439/701 |
| 6,105,300 A | 1/2000 | Schmidt, Jr. et al. | 439/61 |
| 6,083,047 A | 7/2000 | Paagman | 439/608 |
| 6,102,747 A | 8/2000 | Paagman | 439/701 |
| 6,163,464 A | 12/2000 | Ishibashi et al. | 361/788 |
| 6,168,469 B1 | 1/2001 | Lu | 439/608 |
| 6,171,115 B1 | 1/2001 | Mickievicz et al. | 439/76.1 |

*Primary Examiner*—Javaid Nasri

(57) ABSTRACT

An electrical connector assembly is provided for that includes two groups of circuit boards that mate with, or connect to, one another in an orthogonal, or non-parallel manner. The electrical connector includes a plurality of circuit boards; a first connector housing including channels adapted to retain the first group of the circuit boards; a second connector housing also including channels adapted to retain the second group of the circuit boards; and a board interface located between the first and second connector housing. The board interface is formed as part of one of the first and second connector housings. The board interface includes opposing mating faces of the first and second groups of circuit boards that join the first group of circuit boards in a non-parallel relationship to the second group of circuit boards. Preferably, the circuit boards are joined orthogonally. The first connector housing may be a header, while the second connector housing may be a plug, or vice versa. Each circuit board includes signal and ground contacts along an edge joining the board interface. The signal contacts on one circuit board in the first group of circuit boards electrically engage the signal contacts on at least two circuit boards in the second group of circuit boards, and vice versa.

24 Claims, 10 Drawing Sheets

ELECTRICAL CONNECTOR ASSEMBLY FOR ORTHOGONALLY MATING CIRCUIT BOARDS

BACKGROUND OF THE INVENTION

A preferred embodiment of the present invention generally relates to improvements in electrical connectors that connect printed circuit boards to one another and more particularly relates to electrical connectors that orthogonally connect, or mate, printed circuit boards.

Various electronic systems, such as computers, comprise a wide array of components mounted on printed circuit boards, such as daughterboards and motherboards that are interconnected to transfer signals and power throughout the systems. The transfer of signals and power between the circuit boards requires electrical connectors between the circuit boards that are typically through a backplane. The backplane supports part of an electrical connector that joins the two circuit boards.

Typically, a backplane is a printed circuit board that mounts into a server and communication switches. Multiple daughter cards are plugged into the backplane. One circuit board connects to another circuit board via connectors held in the backplane. Hence, in the past, in order for one circuit board to connect to another circuit board, a backplane was required as a conduit there between. As more circuit boards are required, more connections are required with the backplane. Generally, the circuit boards are aligned in parallel, such as a common plane or in parallel planes. The common parallel or planar alignment of multiple circuit boards is, in part, due to the need to afford a space-efficient and good signal quality connection with the backplane.

However, connecting circuit boards via a backplane leads to the potential for signal interference. Because the circuit boards are all connected via the backplane, signals from the various circuit boards may interfere with each other, especially as the signals travel through the common backplane. Additionally, signal strength may be attenuated as signals travel through the backplane. In general, signals passing between two daughterboards pass through at least one connector when input to the backplane and one connector when output from the backplane. The signal is attenuated at each connector.

Thus a need has existed for an electrical connector that directly connects circuit boards. Specifically, a need has existed for an electrical connector that connects circuit boards without a backplane, thereby improving system performance while reducing signal interference and signal attenuation.

SUMMARY OF THE INVENTION

At least one embodiment of the present invention relates to an electrical connector assembly that includes two groups of circuit boards, or wafers, that mate with, or connect to, one another in an orthogonal, or non-parallel manner. The electrical connector includes a plurality of circuit boards; a first connector housing including channels adapted to retain the first group of the circuit boards; a second connector housing also including channels adapted to retain the second group of the circuit boards; and a board interface located between the first and second connector housing. The first connector housing may be a receptacle connector, while the second connector housing may be a plug connector, or vice versa.

The channels in the first and second connector housings, are aligned parallel to, and retain, the first and second groups of circuit boards parallel to the first and second circuit board planes, respectively. In at least one embodiment of the present invention, the first circuit board plane intersects the second circuit board plane along a line extending along a length of the first and second connector housings. The first connector housing, such as a plug connector housing, and the second connector housing, such as a receptacle connector housing, have mating faces that mate with each other in a non-planar interconnection. The non-planar interconnection joins the plug mating edges at an angle to the receptacle mating edges.

The board interface is formed as part of one of the first and second connector housings. The board interface includes opposing mating faces of the first and second groups of circuit boards that join the first group of circuit boards in a non-parallel relationship to the second group of circuit boards. Preferably, the circuit boards are joined orthogonally. The opposing faces include first and second sets of slots that receive the first and second groups of circuit boards, respectively. The first set of slots are aligned transverse to the second set of slots. Additionally, the opposing faces of the board interface may include first and second sets of passages orthogonally joining said first group of circuit boards to the second group of circuit boards.

Each circuit board includes signal and ground contacts along an edge joining the board interface. The signal contacts on one circuit board in the first group of circuit boards electrically engage the signal contacts on at least two circuit boards in the second group of circuit boards, and vice versa.

The electrical connector also includes card-edge terminals that electrically interconnect the first and second groups of circuit boards. The card-edge terminals include a first contact surface on one end arranged to engage a first circuit board and a second contact surface on an opposite end arranged to engage a second circuit board. The first and second contact surfaces orthogonally face one another.

Each circuit board includes signal and ground contacts along an edge joining the board interface. The signal contacts on one circuit board in the first group of circuit boards electrically engage signal contacts on at least two circuit boards in the second group of circuit boards, and vice versa.

One embodiment of the present invention includes a plug connector that includes plug slots defining a plug plane and, a receptacle connector that includes receptacle slots defining a receptacle plane. The plug slots and said receptacle slots receive plug circuit boards and receptacle circuit boards, respectively, along the plug plane aligned in a non-parallel, transverse, or otherwise non-parallel relation to the header plane.

BRIEF DESCRIPTION OF THE DRAWINGS

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE INVENTION

Figure 1:
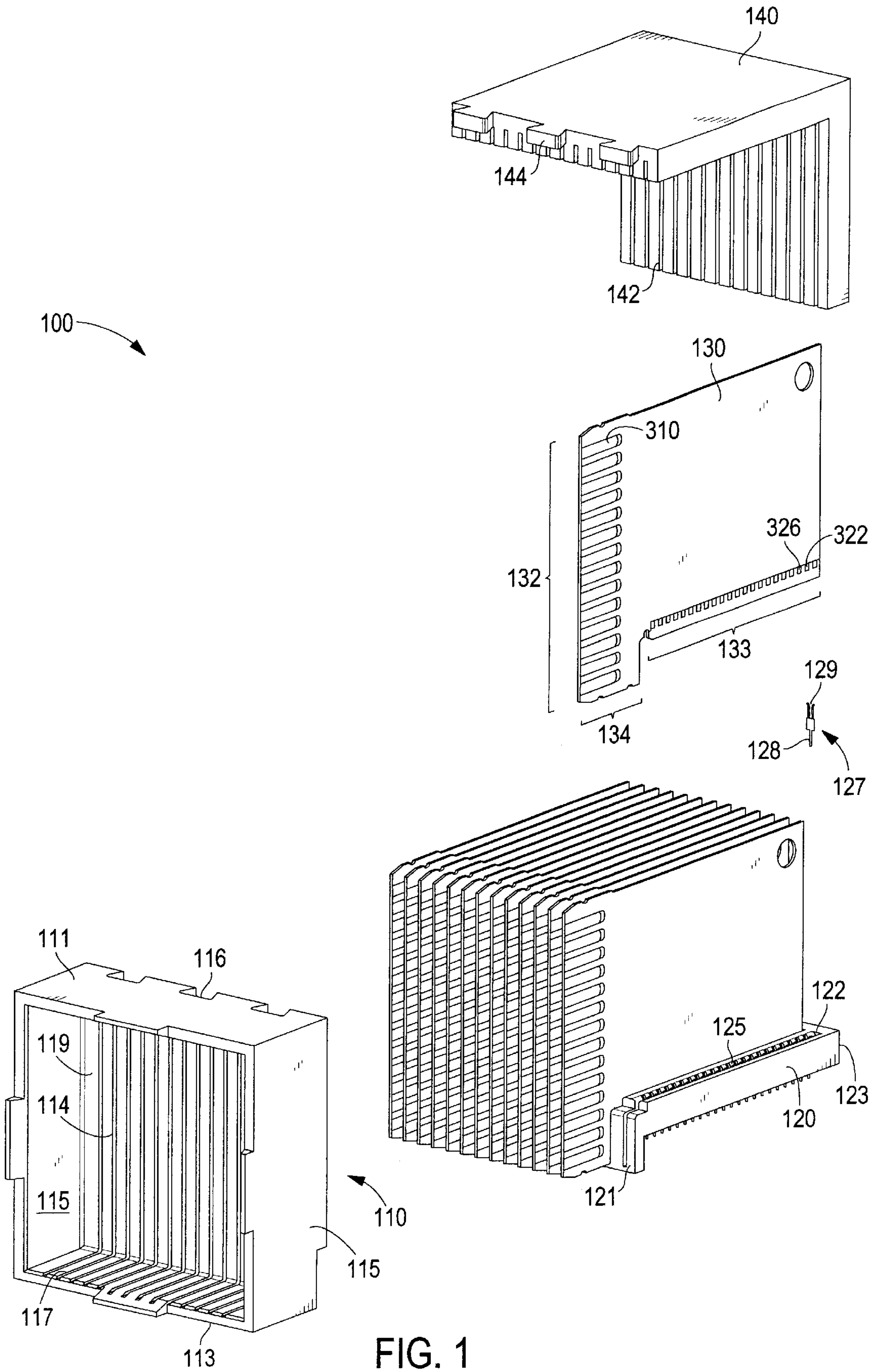
FIG. 1 illustrates an exploded view of a plug connector formed in accordance with an embodiment of the present invention.

FIG. 1 illustrates an exploded view of a plug connector 100 formed in accordance with an embodiment of the present invention. The plug connector 100 includes an interface housing 110, a base 120, a plurality of plug circuit boards 130 (also known as plug wafers), and a cover 140. The interface housing 110 includes top, bottom and side walls, 111, 113, and 115, and a face plate 119. The face plate 119 includes a plurality of board slots 114, and the bottom wall 113 and top wall 111 include a plurality of lower guide slots 117 and upper guide slots (not shown), respectively. Notches 116 are formed on one side of the interface housing 110, for example, the top wall 111. The base 120 includes a front end 121 and a rear end 123, with a plurality of channels 122 extending along a length thereof. Each channel 122 includes a series of receptacles 125. Each receptacle 125 retains a compliant contact 127. Each compliant contact 127 includes a single prong 128 that extends down through the bottom of the base 120. Additionally, each compliant contact 127 includes a double prong 129 that extends up through the top of the base 120. Each plug circuit board 130 includes a plug mating edge 132, a base contact edge 133, and an interface guide edge 134. The plug mating edge 132 includes contact pads 310 along one end as further describe below with respect to FIGS. 3 and 4. The base contact edge 133 includes a plurality of signal and ground contact pads 322 and 326 on either side of the base contact edge 133. The cover 140 includes tabs 144 and slots 142 along a back wall. Each plug circuit board 130 is positioned within a channel 122 of the base 120. The channels 122 are aligned parallel to one another, and retain the plug circuit boards 130. The double prong 129 of the compliant contact 127 that extends up through the base 120 contacts a plug circuit board 130 at signal or ground contact pads 322 or 326 located on either side of the plug circuit board 130 along the base contact edge 133. The base contact edge 133 is held between the prongs of the double prong 129 of the compliant contact 127 so that each prong of the double prong 129 contacts a signal or ground contact pad 322 or 326 located on opposite sides of the base contact edge 133. The single prong 128 of the compliant contact 127 extending down through the base 120 may be connected to a receptacle on a printed circuit board (not shown) or another circuit board (not shown). The number of compliant contacts 127 equals the number of signal or ground contact pads 322 and 326 along one side of the base contact edge 133.

Figure 7:
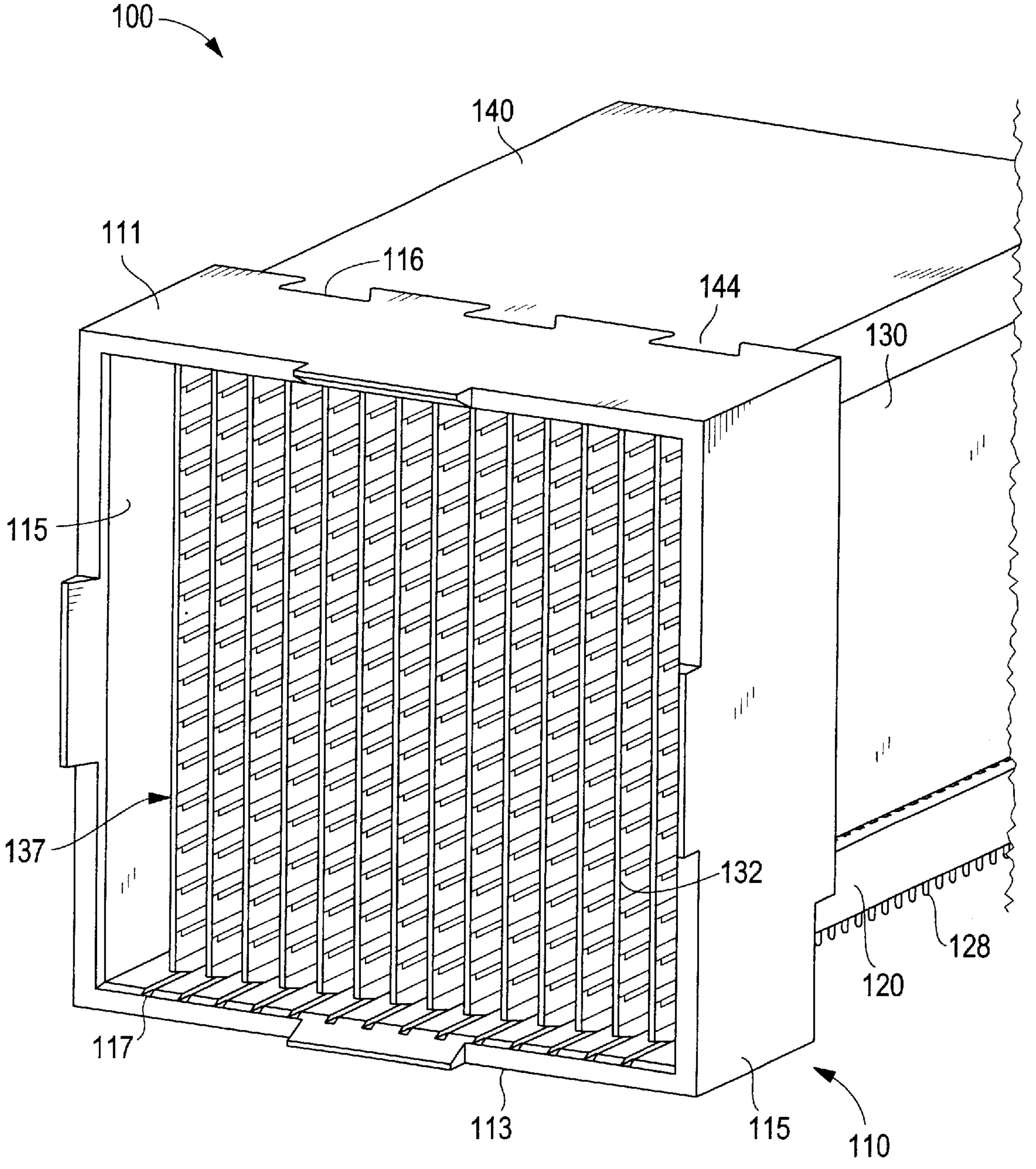
FIG. 7 illustrates an assembled plug connector formed in accordance with an embodiment of the present invention.

The plug mating edges 132 of the plug circuit boards 130 pass through the board slots 114 of the interface housing 110. The plug circuit boards 130 are further retained by the lower guide slots 117 of the interface housing 110. The lower guide slots 117 are parallel to one another and securely retain, the interface guide edges 134 of the plug circuit boards 130. A plug mating face 137, shown below with respect to FIG. 7, is formed once the plug mating edges 132 are positioned within a cavity formed within the interface housing 110. The interface housing 110 connects or fastens to the base 120 to provide more stability to the plug connector 100.

After the plug circuit boards 130 are positioned within the base 120 and the interface housing 110, the cover 140 is mounted onto the base 120 and the interface housing 110. The plug circuit boards 130 are further retained by the cover slots 142 formed in the cover 140. The cover 140 connects to the base 120. Additionally, the cover 140 connects to the interface housing 110 via the tabs 144 that fit into the corresponding notches 116 formed within the interface housing 110. Therefore, the plug connector 100 forms a housing that retains a group of plug circuit boards 130. Alternatively, the cover 140 may connect to the interface housing 110 via a different number of tabs 144, or via a variety of fastening agents, such as screws, glue and the like.

Figure 2:
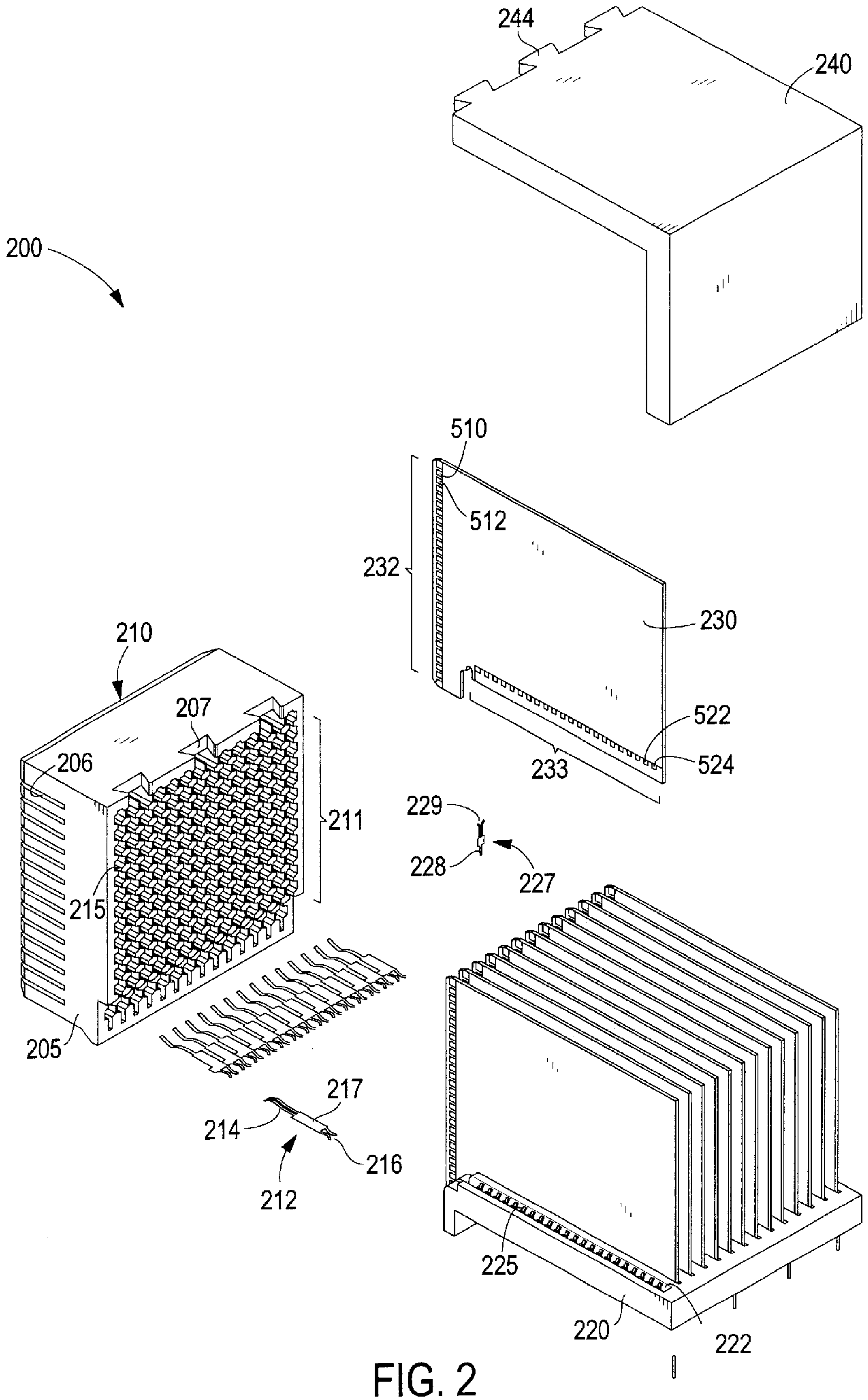
FIG. 2 illustrates an exploded view of a receptacle connector formed in accordance with an embodiment of the present invention.

FIG. 2 illustrates an exploded view of a receptacle connector 200 formed in accordance with an embodiment of the present invention. The receptacle connector 200 includes an interface housing 205, a base 220, a plurality of receptacle circuit boards 230 and a cover 240. The interface housing 205 includes plug circuit board slots 206, a receptacle mating face 210, a terminal passage 211, guide barriers 215 formed between the receptacle mating face 210 and the terminal passage 211, and notches 207. The interface housing 205 allows the passage of rows of card-edge terminals 212. Each card-edge terminal 212 includes a plug interconnect 214, a receptacle interconnect 216 and an intermediate portion 217 connecting the plug interconnect 214 to the receptacle interconnect 216. As further described below with respect to FIGS. 10 and 11, the card edge terminal 212 may be a signal terminal or a ground terminal. The base 220 includes a plurality of parallel channels 222. Each channel 222 includes a series of receptacles 225. Each receptacle 225 retains one compliant contact 227. Each compliant contact 227 includes a single prong 228 that extends down through the bottom of the base 220. Additionally, each compliant contact 227 includes a double prong 229 that extends up through top of the base 220. Each receptacle circuit board 230 includes a receptacle mating edge 232 and a base contact edge 233. The receptacle mating edge 232 and the base contact edge 233 include contact pads 510, 512, 522 and 524, as further described below with respect to FIGS. 5 and 6. The base contact edge 233 includes a plurality of contact pads 522, 524 on either side. The cover 240 includes tabs 244 and slots 242.

Each receptacle circuit board 230 is positioned within a channel 222 of the base 220. The channels 222 are aligned parallel to one another, and retain the receptacle circuit boards 230. The double prong 229 of the compliant contact 227 extends up through the base 220 and contacts a receptacle circuit board 230 at signal or ground contact pads 522 or 524 located on either side of the receptacle circuit board 230 on the base contact edge 233. The base contact edge 233 is held between the prongs of the double prong 229 of the compliant contact 227 so that each prong of the double prong 229 contacts a signal or ground contact pad 522 or 524 located on either side of the base contact edge 233. The single prong 228 of the compliant contact 227 extends down through the base 220 and may be connected to a receptacle on a printed circuit board (not shown) or another circuit board (not shown). The number of compliant contacts 227 equals the number of contact pads 522 and 524 located on one side of the base contact edge 233.

Each receptacle circuit board 230 connects to a card-edge terminal 212 via the receptacle interconnect 216 of the card-edge terminal 212. The receptacle interconnect 216 connects to the receptacle mating edge 232 at ground and signal contact pads 510 and 512. The receptacle interconnect 216 may be shaped like a tuning fork with one prong of the receptacle interconnect 216 contacting a ground and signal contact pad 510 or 512 on one side of the receptacle circuit board 230 while the other prong of the receptacle interconnect 216 contacts a ground and signal contact pad 510 or 512 located on the opposite side of the same receptacle circuit board 230. As additional receptacle circuit boards 230 are positioned within the base 220 and connected to the card-edge terminals 212, straight rows of card-edge terminals 212 are formed due to the coplanar positioning of the ground and signal contact pads 510 and 512 of the receptacle circuit boards 230. Preferably, as further described below with respect to FIGS. 10 and 11, the plug interconnect 214 includes a single beam if the card-edge terminal 212 is a ground terminal, or a double beam if the card-edge terminal 212 is a signal terminal.

Figure 10:
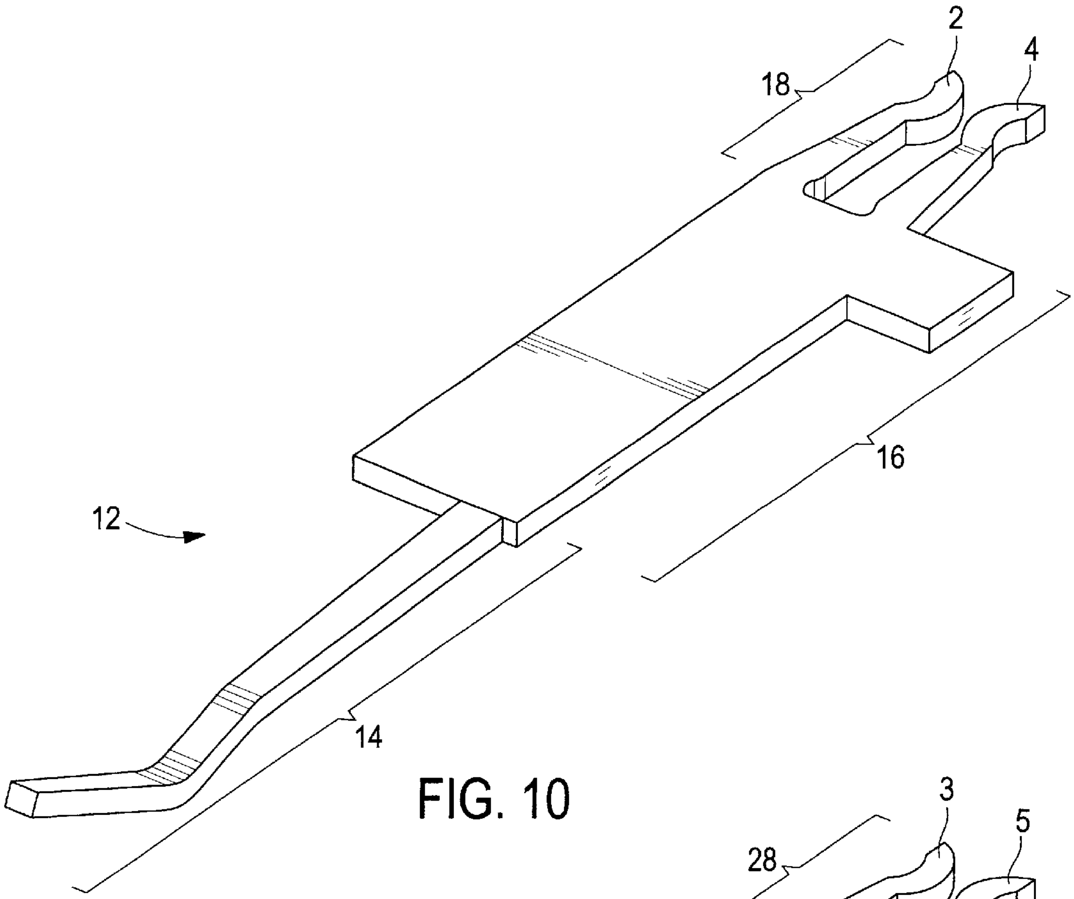
FIG. 10 illustrates a ground terminal formed in accordance with an embodiment of the present invention.

FIG. 10 illustrates a ground terminal 12 formed in accordance with an embodiment of the present invention. The ground terminal 12 includes a single beam plug interconnect 14 on one end of an intermediate portion 16 and a receptacle ground interconnect 18 shaped like a tuning fork on the opposite end. The receptacle ground interconnect 18 includes two prongs 2 and 4. The receptacle ground interconnect 18 may have the same shape as the receptacle interconnect 216 of the general card-edge terminal 212. Therefore one prong 2 of the receptacle ground interconnect 18 contacts a ground contact pad 510 on one side of the receptacle circuit board 230 while the other prong 4 of the receptacle ground interconnect 18 contacts a ground contact pad 510 on the other side of the receptacle circuit board 230. That is, the receptacle circuit board 230 is straddled by the receptacle ground interconnect 18. The single beam plug interconnect 14 contacts a ground contact pad 310 located on one side of the plug circuit board 130.

Figure 11:
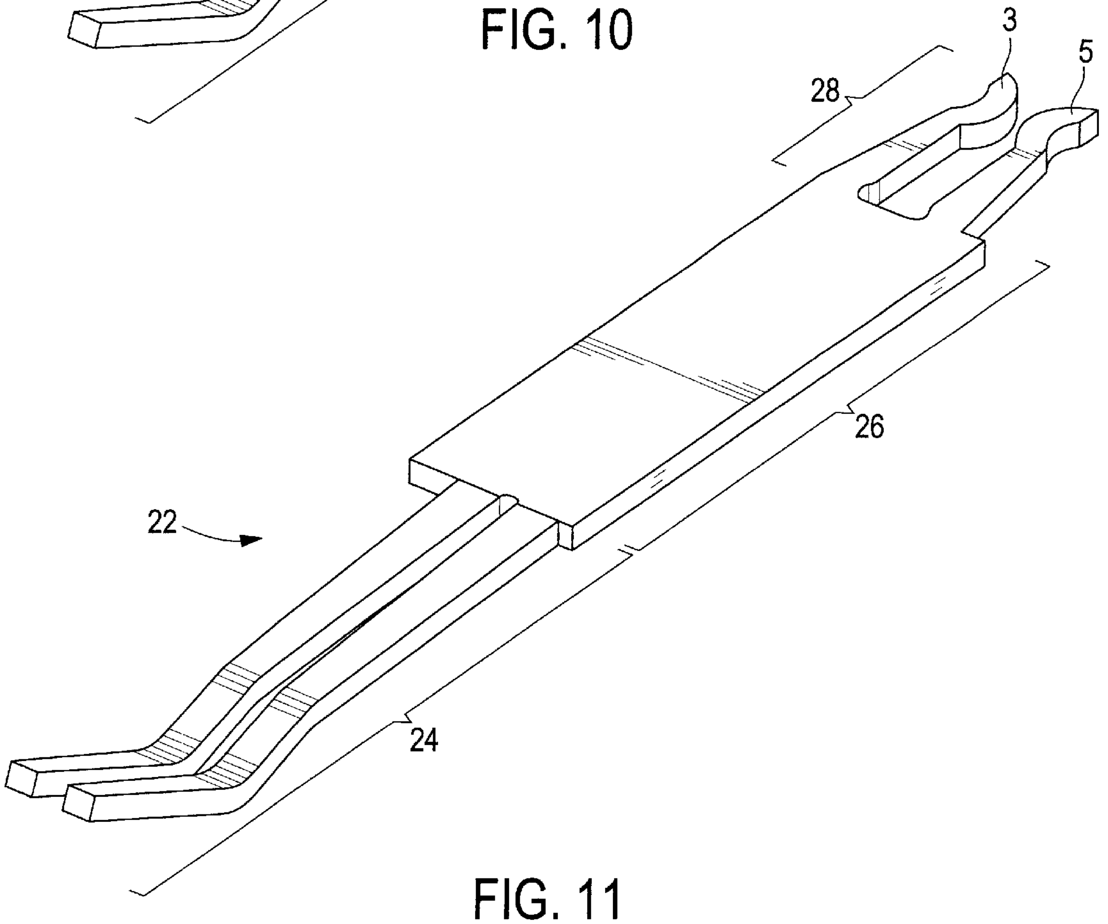
FIG. 11 illustrates a signal terminal formed in accordance with an embodiment of the present invention.

FIG. 11 illustrates a signal terminal 22 formed in accordance with an embodiment of the present invention. The signal terminal 22 includes a double beam plug interconnect 24 on one side of an intermediate portion 26 and a receptacle signal interconnect 28 shaped like a tuning fork on the opposite end. The receptacle signal interconnect 28 includes two prongs 3 and 5. The receptacle signal interconnect 28 may have the same shape as the receptacle interconnect 216 of the general card-edge terminal 212 and the receptacle ground interconnect 18 of the ground terminal 12. Therefore one prong 3 of the receptacle signal interconnect 28 contacts a signal contact pad 512 on one side of the receptacle circuit board 230 while the other prong of the receptacle signal interconnect 28 contacts a signal contact pad 512 on the other side of the receptacle circuit board 230. That is, the receptacle circuit board 230 is straddled by the receptacle signal interconnect 28. The double beam plug interconnect 24 contacts a signal contact pad 410 located on one side of the plug circuit board 130. That is, both beams of the plug interconnect 24 contact one signal contact pad 410 located on one side of the plug circuit board 130.

The signal contact pads 512 are connected to the receptacle signal interconnects 28 of the signal terminals 22. Additionally, the aligned ground contact pads 510 are then connected to the receptacle ground interconnects 18 of the ground terminals 12. Therefore a plurality of parallel rows of ground terminals 12 and signal terminals 22 are formed.

Referring again to FIG. 2, the terminal passage 211 includes a plurality of openings (not shown) that allow each row of card-edge terminals 212, including signal terminals 22 and ground terminals 12, to pass. Preferably, the openings of the terminal passage 211 form cavities that extend from the terminal passage 211 to the receptacle mating face 210. The solid structure formed between the terminal passage 211 and the receptacle mating face 210 forms guide barriers 215 that support the card-edge terminals 212 and the plug mating edges 132 of the plug circuit boards 130. Additionally, the guide barriers 215 guide the plug mating edges 132 into the plug interconnects 214 of the card-edge terminals 212. Each plug interconnect 214 of each card-edge terminal 212 is positioned within the interface housing 205 of the receptacle connector 200. Additionally, the interface housing 205 connects to the base 220 to provide additional stability for the receptacle connector 200.

Figure 8:
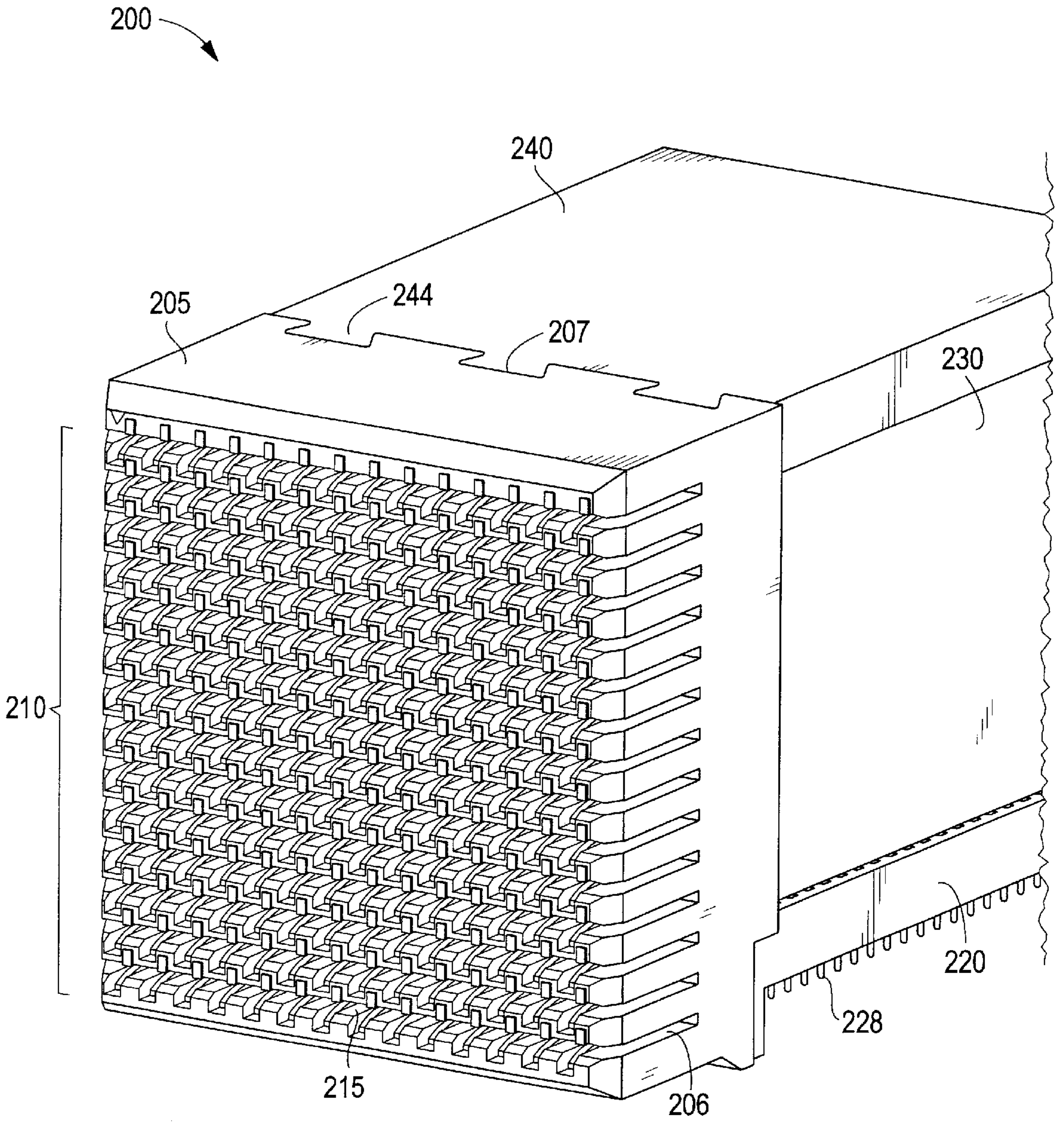
FIG. 8 illustrates an assembled receptacle connector formed in accordance with an embodiment of the present invention.

After the receptacle circuit boards 230 are positioned within the base 220 and the rows of card-edge terminals 212 are positioned within the interface housing 205 and connected to the receptacle circuit boards 230, the cover 240 is positioned onto the base 220 and the interface housing 205 (FIG. 8). The receptacle circuit boards 230 are further retained by slots (not shown) formed in the cover 240. The cover 240 connects to the base 220. Additionally, the cover 240 connects to the interface housing 205 via three tabs 244 that fit into three corresponding notches 207 formed within the interface housing 205. Therefore, the receptacle connector 200 forms a housing that retains a group of receptacle circuit boards 230. Alternatively, the cover 240 may connect to the interface housing 205 via a different number of tabs 244, or via a variety of fastening agents, such as screws, glue and the like.

Figure 3:
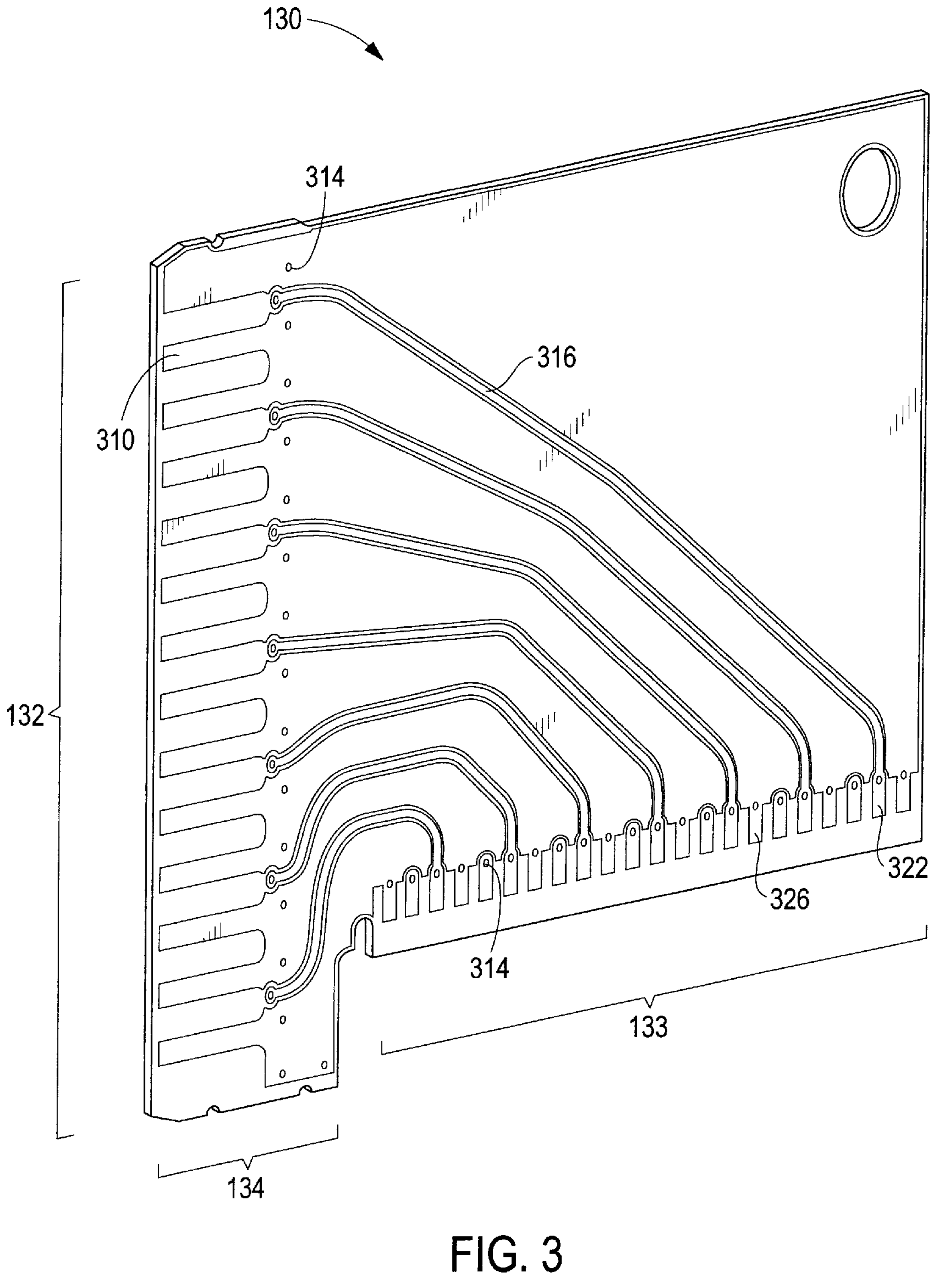
FIG. 3 illustrates a first side of the plug circuit board, or plug wafer, formed in accordance with an embodiment of the present invention.

FIG. 3 illustrates a first side of the plug circuit board 130, or plug wafer, formed in accordance with an embodiment of the present invention. FIG. 3 illustrates one exemplary configuration of signal and ground traces 316 and a plurality of mating ground contact pads 310 and vias 314. The base contact edge 133 includes a plurality of base signal contact pads 322, base ground contact pads 326 and vias 314. Traces 316 and vias 314 on the plug mating edge 132 connect the base signal contact pads 322 to mating signal contact pads, shown below with respect to FIG. 4, located on a second side of the plug circuit board 130. Preferably, the base ground contact pads 326 and base signal contact pads 322 are arranged so that two base ground contact pads 326 are separated by two base signal contact pads 322. The vias 314 provide an electrical connection between the first side of the plug circuit board 130 and the second side of the plug circuit board 130.

Figure 4:
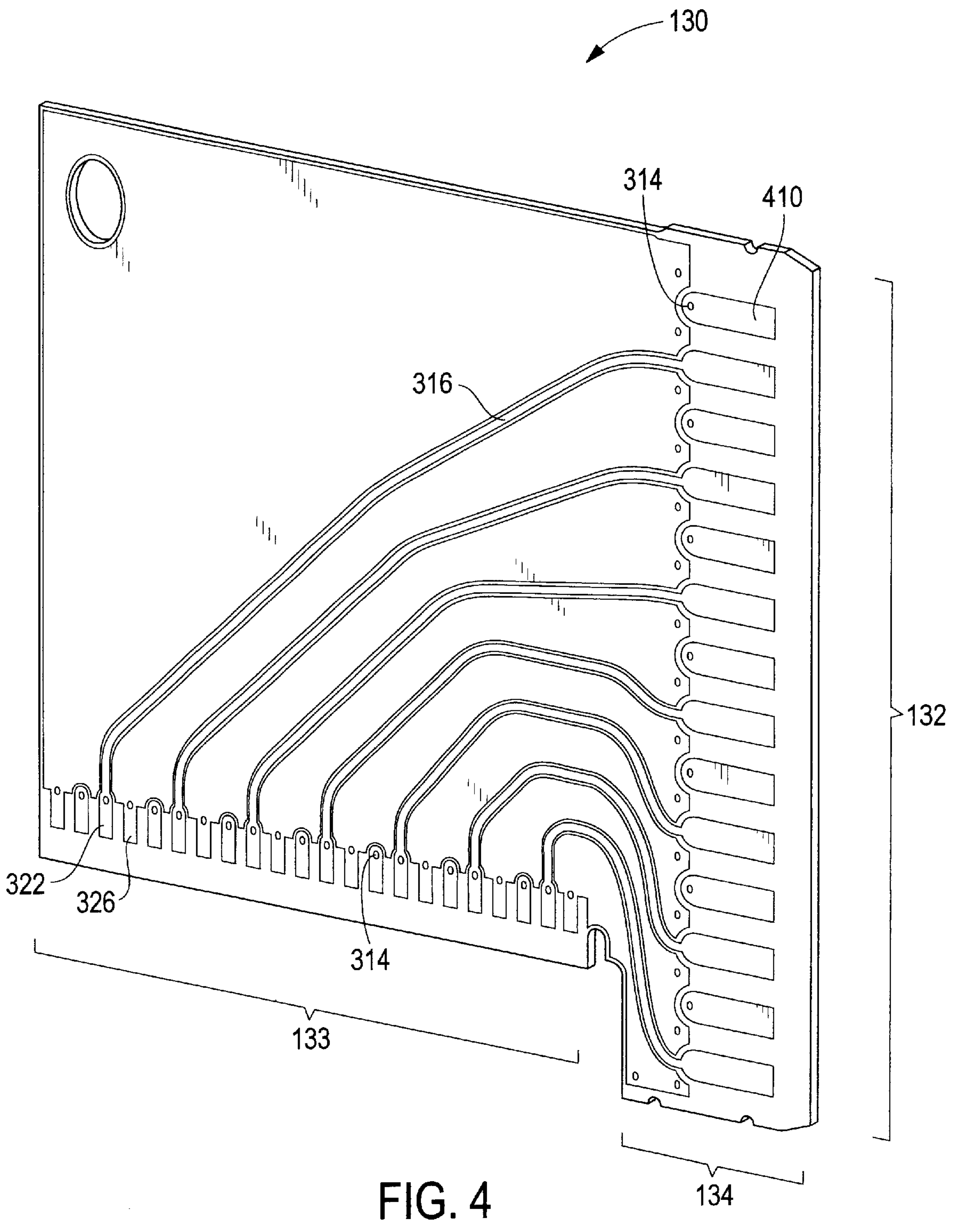
FIG. 4 illustrates a second side of the plug circuit board, or plug wafer with the header mating edge including a plurality of mating signal contact pads and vias.

FIG. 4 illustrates a second side of the plug circuit board 130, or plug wafer with the plug mating edge 132 including a plurality of mating signal contact pads 410 and vias 314. The base contact edge 133 includes a plurality of base signal contact pads 322 and base ground contact pads 326. Traces 316 connect the mating signal contact pads 410 to base signal contact pads 322. Preferably, the base ground contact pads 326 and base signal contact pads 322 are arranged so that two base ground contact pads 326 are separated by two base signal contact pads 322. The vias 314 provide an electrical connection between the second side of the header circuit board 130 and a first side of the header circuit board 130.

Figure 5:
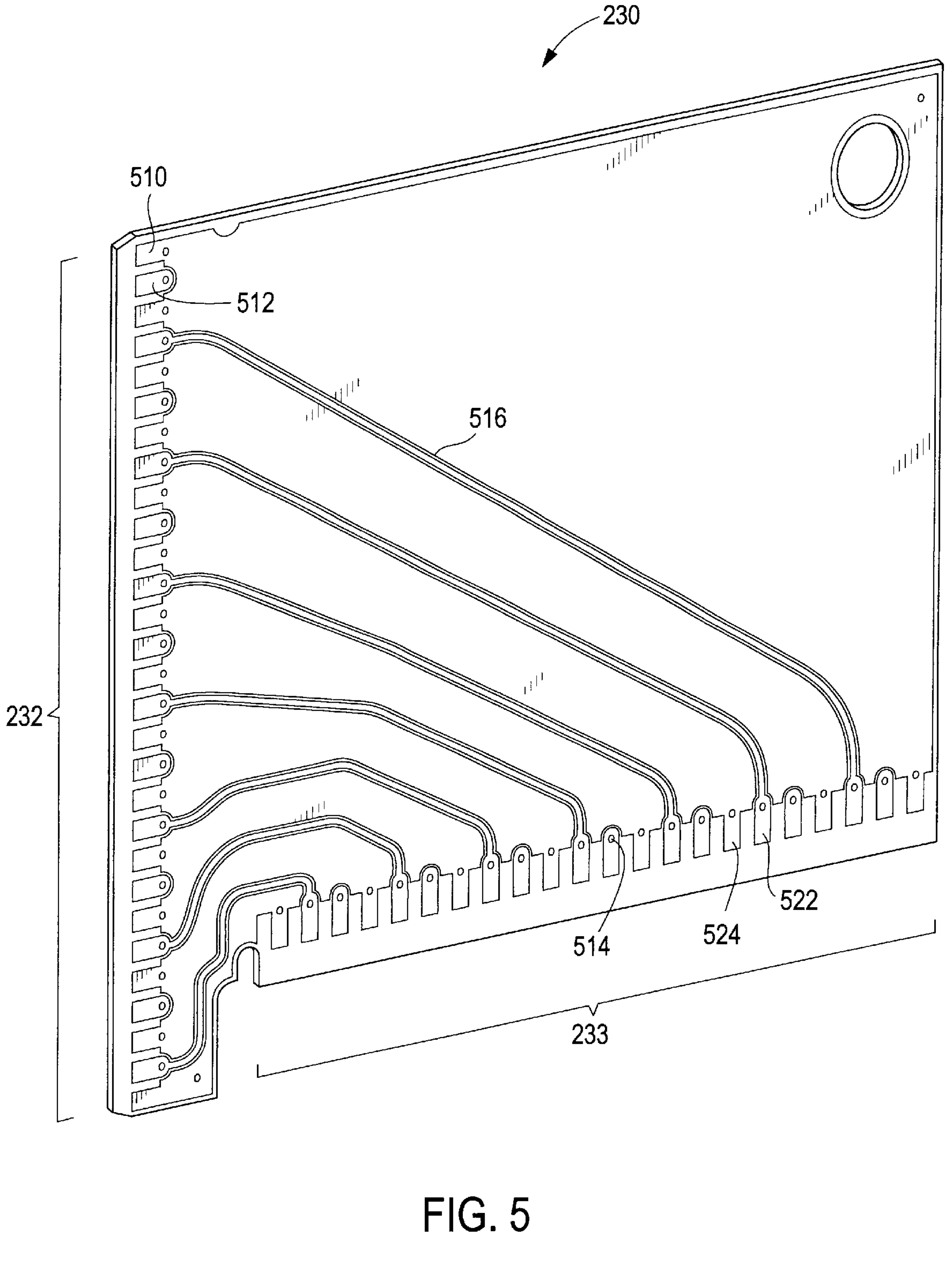
FIG. 5 illustrates a first side of the receptacle circuit board, or receptacle wafer, formed in accordance with an embodiment of the present invention.

FIG. 5 illustrates a first side of the receptacle circuit board 230, or receptacle wafer, formed in accordance with an embodiment of the present invention. The receptacle mating edge 232 includes a plurality of mating ground contact pads 510, mating signal contact pads 512 and vias 514. Preferably, the mating ground contact pads 510 and mating signal contact pads 512 are arranged on the receptacle mating edge 232 in an alternating fashion. That is, two mating ground contact pads 510 are separated by one mating signal contact pad 512, and vice versa. The base contact edge 233 includes a plurality of base signal contact pads 522, base ground contact pads 524 and vias 514. Traces 516 connect the mating signal contact pads 512 to base signal contact pads 522. Preferably, the base ground contact pads 524 and base signal pads 522 are arranged so that two base ground contact pads 524 are separated by two base signal pads 522. The vias 514 provide an electrical connection between the first side of the receptacle circuit board 230 and a second side of the receptacle circuit board 230.

FIG. 5 illustrates a first side of the receptacle circuit board 230, or receptacle wafer, formed in accordance with an embodiment of the present invention. The receptacle mating edge 232 includes a plurality of mating ground contact pads 510, mating signal contact pads 512 and vias 514. Preferably, the mating ground contact pads 510 and mating signal contact pads are arranged on the receptacle mating edge 232 in an alternating fashion. That is, two mating ground contact pads 510 are separated by one mating signal contact pad 512, and vice versa. The base contact edge 233 includes a plurality of base signal contact pads 522, base ground contact pads 524 and vias 514. Traces 516 connect the mating signal contact pads 512 to base signal contact pads 522. Preferably, the base ground contact pads 524 and base signal pads 522 are arranged so that two base ground contact pads 524 are separated by two base signal pads 522. The vias 514 provide an electrical connection between the first side of the receptacle circuit board 230 and a second side of the receptacle circuit board 230.

Figure 6:
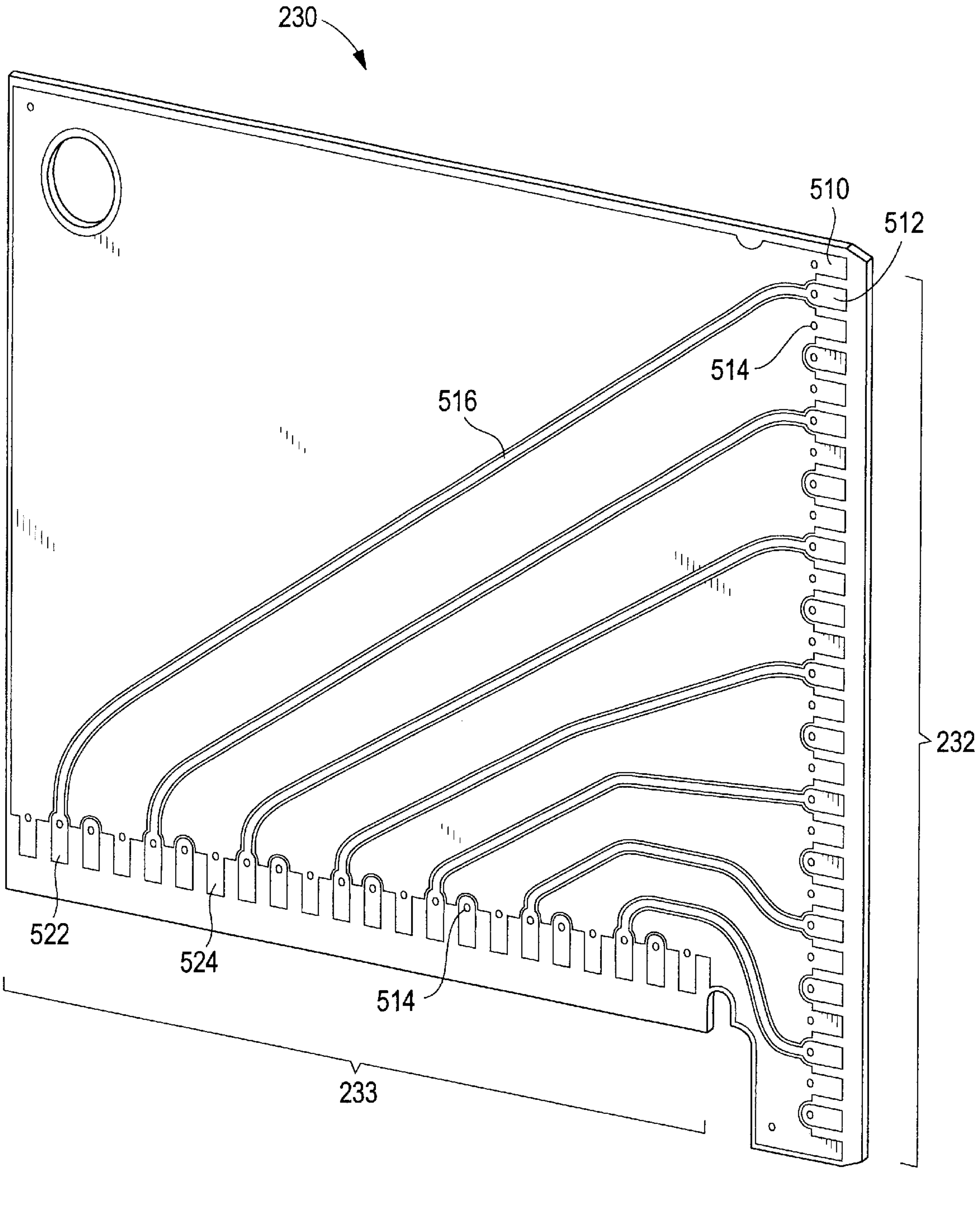
FIG. 6 illustrates a second side of the receptacle circuit board, or receptacle wafer.

FIG. 6 illustrates a second side of the receptacle circuit board 230, or receptacle wafer. The receptacle mating edge 232 includes a plurality of mating ground contact pads 510, mating signal contact pads 512 and vias 514. Preferably, the mating ground contact pads 510 and mating signal contact pads are arranged on the receptacle mating edge 232 in an alternating fashion. That is, two mating ground contact pads 510 are separated by one mating signal contact pad 512, and vice versa. The base contact edge 233 includes a plurality of base signal contact pads 522, base ground contact pads 524 and vias 514. Traces 516 connect the mating signal contact pads 512 to base signal contact pads 522. Preferably, the base ground contact pads 524 and base signal pads 522 are arranged so that two base ground contact pads 524 are separated by two base signal pads 522. The vias 514 provide an electrical connection between the second side of the receptacle circuit board 230 and the first side of the receptacle circuit board 230.

FIG. 7 illustrates an assembled plug connector 100 formed in accordance with an embodiment of the present invention. As further described above with respect to FIG. 1, the plug connector 100, as shown in FIG. 7, includes the interface housing 110 connected to the base 120 and the cover 140. The outermost plug circuit boards 130 form side walls (only one side wall shown) of the plug connector 100. The cover 140 is fastened onto the interface housing via the notches 116 of the interface housing receiving the tabs 144 of the cover 140.

The plug mating face 137 is formed via the alignment and positioning of the plug circuit boards 130 on the lower guide slots 117. The plug mating face 137 is formed within the cavity formed within the interface housing 110.

The single prongs 128 of the compliant contacts 127 are connected to the base contact edges 133 of the plug circuit boards 130 via the double prongs 129. Because the plug circuit boards 130 are aligned parallel to each other, the compliant contacts 127 are aligned in parallel rows. Therefore, the single prongs 128 of the compliant contacts 127 extend through the bottom of the base 120 thereby forming parallel rows of single prongs 128. The single prongs 128 of the compliant contacts 127 may be positioned within receptacles (not shown) formed in a printed circuit board (not shown).

FIG. 8 illustrates an assembled receptacle connector 200 formed in accordance with an embodiment of the present invention. As further described above with respect to FIG. 2, the receptacle connector 200 includes the interface housing 205 connected to the base 220. The outermost receptacle circuit boards 230 form side walls (only one shown) of the receptacle connector 200. The interface housing 205 and the base 220 are both connected to the cover 240. The cover 240 is connected to the interface housing 205 via the receipt of the tabs 244 by the notches 207.

The plug circuit board receptacle slots 206 are formed in the interface housing 205. The plug circuit board receptacle slots 206 follow the contour of the interface housing 205 starting from one side of the interface housing 205 and extending over the surface of the receptacle mating face 210. The plug circuit board receptacle slots 206 are parallel with each other and correspond directly to the plug circuit boards 130 positioned within the plug connector 100. The plug circuit boards 130 positioned within the plug mating face 137 are mated into the receptacle connector 200 via the plug circuit board receptacle slots 206.

The receptacle mating face 210 includes a plurality of guide barriers 215 formed within the receptacle mating face 210. The guide barriers 215 support the plug circuit boards 130 after the plug circuit boards 130 are connected to the receptacle connector 200 via the mating of the plug mating face 137 with the receptacle mating face 210. Additionally, the guide barriers 215 guide the plug mating edges 132 to the plug interconnects 214 of the card-edge terminals 212 that are located within the interface housing 205. Additionally, the card-edge terminals 212 are also supported by the guide barriers 215 that extend from the receptacle mating face 210 to the terminal passage 211.

The single prongs 228 of the compliant contacts 227 are connected to the base contact edges 233 of the receptacle circuit boards 230 via the double prongs 229. Because the receptacle circuit boards 230 are aligned parallel to each other, the compliant contacts 227 are aligned in parallel rows. Therefore, the single prongs 228 of the compliant contacts 227 extend through the bottom of the base 220 thereby forming parallel rows of single prongs 228. The single prongs 228 of the compliant contacts 227 may be positioned within receptacles (not shown) formed in a printed circuit board (not shown).

Figure 9:
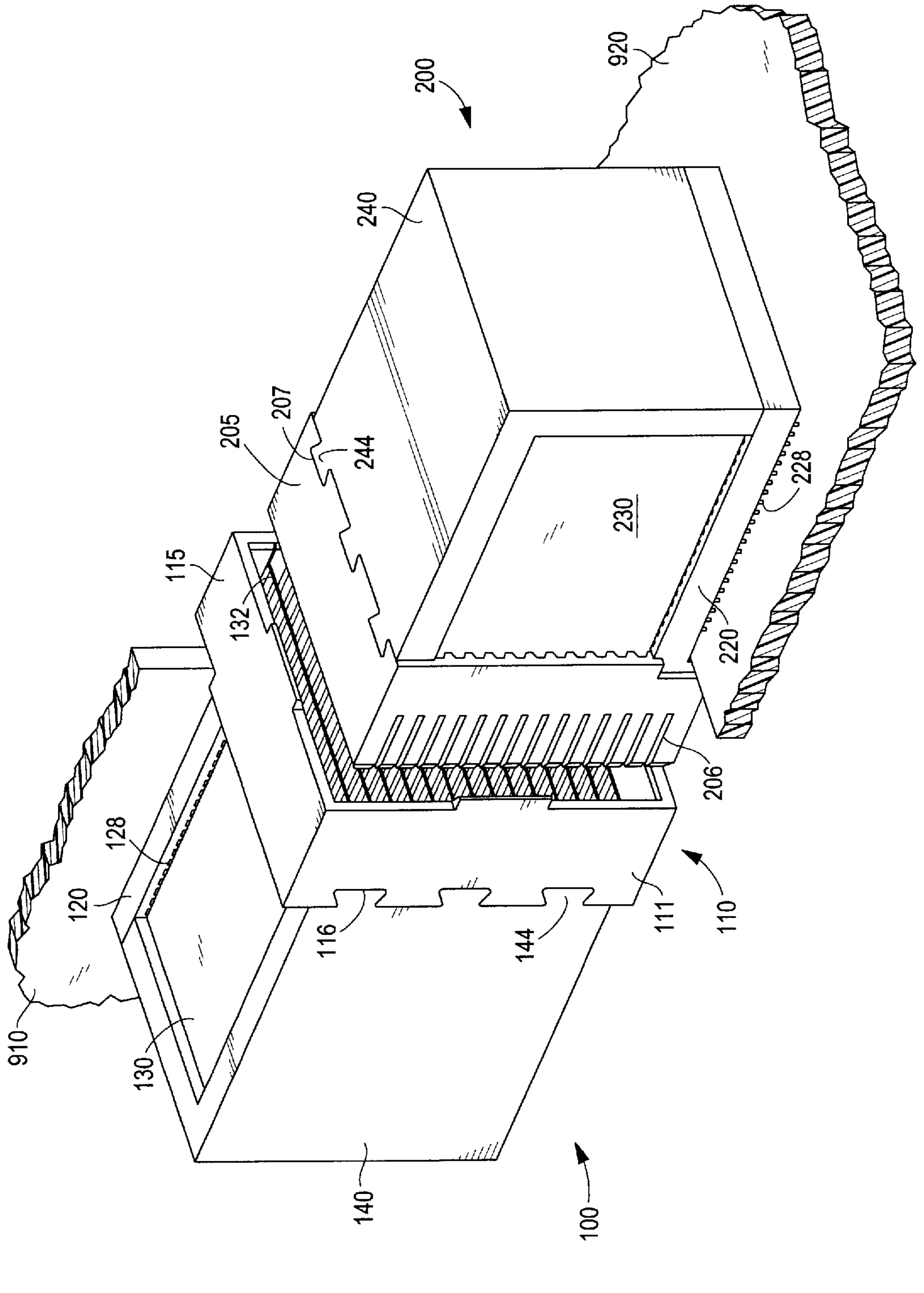
FIG. 9 illustrates the receptacle connector and the plug connector prior to mating according to an embodiment of the present invention.

FIG. 9 illustrates the plug connector 100 and the receptacle connector 200 prior to mating according to an embodiment of the present invention. The plug connector 100 is connected to a printed circuit board 910 via the single prongs 128 of the compliant contacts 127. The receptacle connector 200 is connected to a printed circuit board 920 via the single prongs 228 of the compliant contacts 227.

In operation, the plug circuit boards 130 mate with the receptacle circuit boards 230 via the mating of the receptacle mating face 210 and the plug mating face 137 in an orthogonal manner. That is, when the receptacle connector 200 is mated with the plug connector 100, the receptacle circuit boards 230 are transverse to, or rotated 900 in relation to, the plug circuit boards 130. Therefore, if the plug connector 100 is positioned in an orientation such that the plug circuit boards 130 are arranged in horizontal rows, the receptacle circuit boards 230 are thereby arranged in vertical columns when the plug connector 100 is mated to the receptacle connector 200. Conversely, if the plug connector 100 is positioned in an orientation such that the plug circuit boards are arranged in vertical columns, the receptacle circuit boards 230 are thereby arranged in horizontal rows when the plug connector 100 is mated to the receptacle connector 200. That is, the plug mating face 137 opposes the receptacle mating face 210 when the plug mating face 137 interfaces with the receptacle mating face 210. A board interface is formed as the receptacle connector 200 is mated with the plug connector 100.

As the plug mating face 137 is mated with the receptacle mating face 210, the plug circuit boards 130 are moved into the interface housing 205 of the receptacle connector 200 via the plug circuit board receptacle slots 206 until the plug mating edges 132 contact the plug interconnects 214 of the card-edge terminals 212. As the plug mating edges 132 move into the interface housing 205, the receptacle mating face 210 is mated with the plug mating face 137 located within the cavity formed within the interface housing 110 of the plug connector 100. Preferably, once the plug connector 100 and the receptacle connector 200 are fully mated, the interface housing 205 of the receptacle connector 200 is fastened into the interface housing 110 of the plug connector 100.

The plug mating edges 132 of the plug circuit boards 130 connect to the plug interconnects 214 once the plug connector 100 is fully mated with the receptacle connector 200. Once mated, horizontal rows of the plug circuit boards 130 are connected to vertical columns of the receptacle circuit boards 230. Conversely, the plug connector 100 may be mated to the receptacle connector 200 in such a manner that vertical columns of the plug circuit boards 130 are connected to horizontal rows of the receptacle circuit boards 230. That is, the plug circuit boards 130 are connected to the receptacle circuit boards 230 in an orthogonal fashion. Therefore, the plug connector 100 orthogonally connects to the receptacle connector 200. The orthogonal connection of the plug connector 100 to the receptacle connector 200 forms a board interface between the plug connector 100 and the receptacle connector 200. Thus, the printed circuit boards 910, 920 are physically and electrically connected via the union of the plug connector 100 and the receptacle connector 200 without the need of a back plane.

As stated above with respect to FIG. 2, the plug interconnect 214 may be a ground terminal 12 or a signal terminal 22. If the card-edge terminal 212 is a signal terminal 22, the double beam plug interconnect 24 contacts one mating signal contact pad 410 of the plug mating edge 132. Because the mating signal contact pads 410 of a particular plug circuit board 130 are located on only one side of the plug circuit board 130 as shown in FIG. 4, only one side of the plug circuit board 130 contacts the double beam plug interconnects 24. The plug circuit board 130 connects to a particular receptacle circuit board 230 via the signal terminal 22. That is, because the double beam plug interconnect 24 and the receptacle signal interconnect 28 are connected via the intermediate portion 26, the signal terminal 22 forms a physical and electrical connection between the plug circuit board 130 and the receptacle circuit board 230. If, however, the card-edge terminal 212 is a ground terminal 12, the single beam plug interconnect 14 contacts one mating ground contact pad 310 of the plug mating edge 132. Because the mating ground contact pads 310 are located on the opposite side of the plug circuit board 130 as the mating signal contact pads 410, only one side of the plug circuit board 130 contacts the single beam plug interconnects 14. The plug circuit board 130 connects to a particular plug circuit board via the ground terminal 12. That is, because the single beam plug interconnect 14 and the receptacle ground interconnect 18 are connected via the intermediate portion 16, the ground terminal 12 forms a physical link between the plug circuit board 130 and the receptacle circuit board 230.

The card-edge terminals 212 extend into the interface housing 205 of the receptacle connector 200 via the terminal passage 211. As stated above with respect to FIG. 2, the receptacle interconnect 216 of each card-edge terminal 212 may be shaped like a tuning fork. The receptacle mating edge 232 of the receptacle circuit board 230 is positioned between the two tuning fork prongs of the receptacle interconnect 216. Each prong of the receptacle interconnect 216 contacts either a signal contact pad 512, or a ground signal contact pad 510 located on either side of the receptacle mating edge 232. That is, the receptacle signal interconnect 28 of the signal terminal 22 contacts a signal contact pad 512 on one side of the receptacle circuit board 230 while simultaneously contacting a signal contact pad 512 on the other side of the receptacle circuit board 230. Similarly, a receptacle ground interconnect 18 of the ground terminal 12 contacts a ground contact pad 510 on one side of the receptacle circuit board 230 while simultaneously contacting a ground contact pad on the other side of the receptacle circuit board 230.

As discussed above, each plug circuit board 130 includes multiple, or a plurality of, mating ground and signal contact pads 310, 410 located on opposite sides of each plug mating edge 132. Each mating ground or signal contact pad 310, 410 connects to a plug interconnect 214 of a card-edge terminal 212 when the plug connector 100 is mated to the receptacle connector 200. Each card-edge 212 connects to either two mating signal contact pads 512, or two mating ground contact pads 510 located on either side of a receptacle circuit board 230 via the receptacle interconnect 216. Therefore, each plug circuit board 130 is physically and electrically connected to multiple receptacle circuit boards 230.

Similarly, each receptacle circuit board 230 includes multiple, or a plurality of, mating ground and signal contact pads 510, 512. A pair of mating ground or signal contact pads 510, 512 connect to a receptacle connector 216 of a card-edge terminal 212 when the receptacle connector 200 is mated to the plug connector 100. Each card-edge terminal 212 connects to a mating ground or signal contact pad 310 or 410 located on one side of a plug circuit board 130 via the plug interconnect 214. Therefore, each receptacle circuit board 230 is physically and electrically connected to multiple plug circuit boards 130.

Alternatively, the plug circuit boards 130 may be configured similar to the receptacle circuit boards 230. That is, the plug circuit boards 130 may have mating ground and signal contact pads 310, 410 on both sides of the plug circuit board. In that case, the card-edge terminal 212 may include a tuning fork plug interconnect and a tuning fork receptacle interconnect. Thus, the tuning fork receptacle interconnect may be positioned in an orientation that is rotated 90° from that of the tuning fork plug interconnect.

Thus, at least some of the above embodiments provide an improved electrical connector for edge mating circuit boards. The electrical connectors connect printed circuit boards without a back plane. At least some of the above embodiments provide a more direct connection between the printed circuit boards thereby improving system performance by reducing signal interference and attenuation.

While the embodiments discussed above primarily concern configurations in which the plug connector 100 and the receptacle connector 200 are oriented orthogonal to one another, alternative angular orientations may be provided. For example, the rows of header and plug circuit boards 130 and 230 may be arranged at other non-parallel configurations, such as obtuse or acute angles with respect to one another.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications that incorporate those features coming within the scope of the invention.

What is claimed is:

1. An electrical connector assembly comprising:

a plurality of circuit boards;

a first connector housing including channels adapted to retain a first group of circuit boards;

a second connector housing including channels adapted to retain a second group of circuit boards; and a board interface located between said first and second connector housing, said board interface having opposing faces joining said first group of circuit boards in a non-parallel relationship to said second group of circuit boards, wherein said board interface connects one circuit board in said first group to at least two circuit boards in said second group.

2. The electrical connector assembly of claim 1, wherein said channels in said first and second connector housings are aligned parallel to, and retain, said first and second groups of circuit boards parallel to first and second circuit board planes, respectively, said first circuit board plane intersecting said second circuit board plane along a line extending along a length of said first and second connector housings.

3. The electrical connector assembly of claim 1, wherein said opposing faces of said board interface include first and second sets of passages orthogonally joining said first group of circuit boards to said second group of circuit boards.

4. The electrical connector assembly of claim 1, wherein said opposing faces include first and second sets of slots receiving said first and second groups of circuit boards, respectively.

5. The electrical connector assembly of claim 4, wherein said first set of slots is aligned transverse to said second set of slots.

6. The electrical connector assembly of claim 4, wherein said first set of slots is aligned orthogonal to said second set of slots.

7. The electrical connector assembly of claim 1, wherein said board interface is formed as part of one of said first and second connector housings.

8. The electrical connector assembly of claim 1, wherein said board interface includes horizontal rows of slots in one face and vertical columns of slots in an opposite face.

9. The electrical connector assembly of claim 1, further comprising card-edge terminals electrically interconnecting said first and second groups of circuit boards, said card-edge terminals having a first contact surface on one end arranged to engage a first circuit board and a second contact surface on an opposite end arranged to engage a second circuit board, said first and second contact surfaces facing orthogonal to one another.

10. An electrical connector assembly comprising:

a plurality of circuit boards;

a first connector housing including channels adapted to retain a first group of circuit boards;

a second connector housing including channels adapted to retain a second group of circuit boards; and a board interface located between said first and second connector housing, said board interface having opposing faces joining said first group of circuit boards in a non-parallel relationship to said second group of circuit boards, wherein each circuit board includes signal and ground contacts along an edge joining said board interface, and wherein signal contacts on one circuit board in said first group of circuit boards electrically engage signal contacts on at least two circuit boards in said second group of circuit boards.

11. An electrical connector assembly comprising:

a plurality of circuit boards;

a first connector housing including channels adapted to retain a first group of circuit boards;

a second connector housing including channels adapted to retain a second group of circuit boards;

a board interface located between said first and second connector housing, said board interface having opposing faces joining said first group of circuit boards in a non-parallel relationship to said second group of circuit boards; and a group of terminals arranged in a row along said board interface and electrically engaging one circuit board in said first group and multiple circuit boards in said second group.

12. An electrical connector comprising:

a plurality of circuit boards;

a plug connector retaining multiple plug circuit boards arranged in rows, each plug circuit board having a plug mating edge; and a receptacle connector retaining multiple receptacle circuit boards arranged in columns, each receptacle circuit board having a receptacle mating edge, said plug connector and receptacle connector having mating faces mated in a non-parallel relationship to join said plug mating edges at an angle to said receptacle mating edges, wherein each receptacle circuit board includes signal and ground contacts along said receptacle mating edge, wherein each plug circuit board includes signal and ground contacts along said plug mating edge, and wherein said signal contacts along said plug mating edge electrically engage said signal contacts along said receptacle mating edge on at least two receptacle circuit boards.

13. The electrical connector of claim 12, wherein one of said plug connector and said receptacle connector include a mating end with first and second sets of slots arranged transverse to one another.

14. The electrical connector of claim 12, further including a mating interface retaining said receptacle circuit boards in said rows and said plug circuit boards in said columns when mated, said rows and columns being orthogonal to one another.

15. The electrical connector of claim 12, wherein said plug connector includes plug slots defining a plug plane and, wherein said receptacle connector includes header slots defining a receptacle plane, said plug slots and said receptacle slots receiving said plug circuit boards and said receptacle circuit boards, respectively, along said plug plane aligned in a non-parallel relation to said receptacle plane.

16. The electrical connector of claim 15, wherein said plug slots are aligned orthogonally to said header slots.

17. The electrical connector of claim 12, further including:

a board interface located between said plug connectors and said receptacle connector, said board interface including a plurality of passages there through aligned with said rows and columns; and a group of terminals in said passages, said terminals connecting a row of contacts on one plug circuit board to contacts on multiple receptacle circuit boards.

18. An electrical connector comprising:

a plurality of circuit boards;

a plug connector retaining multiple plug circuit boards arranged in rows, each plug circuit board having a plug mating edge; and a receptacle connector retaining multiple receptacle circuit boards arranged in columns, each receptacle circuit board having a receptacle mating edge, said plug connector and receptacle connector having mating faces mated in a non-parallel relationship to join said plug mating edges at an angle to said receptacle mating edges, wherein each receptacle circuit board includes signal and ground contacts along said receptacle mating edge, wherein each plug circuit board includes signal and ground contacts along said plug mating edge, and wherein said signal contacts along said receptacle mating edge electrically engage said signal contacts along said plug mating edge on at least two plug circuit boards.

19. A system for electrically connecting printed circuit boards including:

a plurality of wafers, a first connector housing including channels adapted to retain a first group of wafers;

a second connector housing including channels adapted to retain a second group of wafers;

card-edge terminals electrically interconnecting said first and second groups of circuit boards; and a board interface located between said first and second connector housings, said board interface includes first and second mating faces orthogonally joining said first group of wafers to said second group of wafers, said board interface holding said card-edge terminals to project from said first and second mating faces to engage said first and second groups of circuit boards, wherein said board interface connects one wafer in said first group to at least two wafers in said second group.

20. The system of claim 19, wherein said card-edge terminal has a first contact surface on one end arranged to engage a first wafer and a second contact surface on an opposite end arranged to engage a second wafer, said first and second wafers facing orthogonal to one another.

21. The system of claim 19, wherein said channels in said first and second connector housings are aligned parallel to, and retain said first and second groups of wafers in first and second planes, respectively, said first wafer plane being aligned in a non-parallel relation to said second circuit plane.

22. The system of claim 19, wherein each wafer includes signal and ground contacts along an edge joining said board interface, and wherein signal contacts on one wafer in said first group of wafers electrically engage signal contacts on at least two circuit boards in said second group of wafers.

23. The system of claim 19, wherein said board interface includes horizontal rows of slots in one face and vertical columns of slots in an opposite face.

24. The system of claim 19, wherein said board interface is formed as part of one of said first and second connector housings.

* * * * *